(12) United States Patent
Paul et al.

(10) Patent No.: US 10,615,780 B2
(45) Date of Patent: Apr. 7, 2020

(54) LOW POWER 25% DUTY CYCLE LOCAL OSCILLATOR CLOCK GENERATION CIRCUIT

(71) Applicant: QUALCOMM Incorporated, San Diego, CA (US)

(72) Inventors: Animesh Paul, Bangalore (IN); Xinhua Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 115 days.

(21) Appl. No.: 15/835,861

(22) Filed: Dec. 8, 2017

(65) Prior Publication Data

US 2019/0181844 A1    Jun. 13, 2019

(51) Int. Cl.
| | |
|---|---|
| H03K 3/017 | (2006.01) |
| H03K 5/02 | (2006.01) |
| H03K 5/156 | (2006.01) |
| H03K 19/20 | (2006.01) |
| H03K 19/21 | (2006.01) |
| H03K 19/0948 | (2006.01) |
| H03K 5/00 | (2006.01) |
| H03D 7/14 | (2006.01) |

(52) U.S. Cl.
CPC .......... *H03K 3/017* (2013.01); *H03D 7/1458* (2013.01); *H03D 7/1466* (2013.01); *H03K 5/023* (2013.01); *H03K 5/1565* (2013.01); *H03K 19/0948* (2013.01); *H03K 19/20* (2013.01); *H03K 19/215* (2013.01); *H03K 2005/00234* (2013.01)

(58) Field of Classification Search
CPC .......... H03K 3/017; H03K 5/05; H03K 19/20; H03K 19/23; H03K 19/094; H03K 19/0941; H03K 19/0944; H03K 19/0948
See application file for complete search history.

(56) References Cited

U.S. PATENT DOCUMENTS

| | | | | |
|---|---|---|---|---|
| 4,851,713 A | * | 7/1989 | Lee | H03K 19/0948 326/121 |
| 6,958,628 B2 | * | 10/2005 | Zanchi | H03K 5/1515 326/121 |
| 7,821,315 B2 | * | 10/2010 | Bossu | H03K 5/1565 327/175 |
| 9,093,956 B2 | * | 7/2015 | Theodoratos | H03D 7/1441 |
| 2007/0152714 A1 | * | 7/2007 | Wu | H03K 19/20 326/113 |
| 2008/0014896 A1 | * | 1/2008 | Zhuo | H03D 7/166 455/326 |

* cited by examiner

*Primary Examiner* — Ryan Johnson
(74) *Attorney, Agent, or Firm* — Qualcomm Incorporated

(57) ABSTRACT

In certain aspects, a clock generation circuit couples to a first clock having a first duty cycle and a second clock having the first duty cycle. The second clock lags the first clock by 90 degrees in phase. The clock generation circuit is configured to couple the output terminal to a ground when the first clock and the second clock both are at logic high and decouple the output terminal from the ground when at least one of the first clock and the second clock is at logic low and couple a supply voltage to the output terminal only when the first clock is at logic low and decouple the supply voltage from the output terminal when the first clock is at logic high. The clock generation circuit generates clock signals having a second duty cycle.

10 Claims, 15 Drawing Sheets

LOW POWER 25% DUTY CYCLE LOCAL OSCILLATOR CLOCK GENERATION CIRCUIT

BACKGROUND

Field

Aspects of the present disclosure relate generally to local oscillator clock generation, and more particularly, to 25% duty cycle local oscillator clock generation circuits and methods.

Background

Mixers are used in a variety of RF/microwave applications, including military radar, cellular base stations, cellular mobile stations, and more. An RF mixer is a three-port passive or active device that can modulate or demodulate a signal. The purpose is to change the frequency of an electromagnetic signal while (hopefully) preserving every other characteristic (such as phase and amplitude) of the initial signal. The three ports are referred to as the RF input port, local oscillator clock input port, and the IF (intermediate frequency) output port. A mixer is also known as a downconverter if the mixer is part of a receiver or as an upconverter if it is part of a transmitter.

The local oscillator clocks are used by one or more mixers to change the frequency of an RF signal. The local oscillator clock generation circuit must produce a stable frequency with low harmonics. Stability must take into account temperature, voltage, and mechanical drift as factors. The local oscillator clock generation circuit must produce enough output power to effectively drive subsequent stages of circuitry, such as mixers or frequency multipliers.

Accordingly, it would be beneficial to provide an improved circuits and methods of local oscillator clock generation that reduce power consumption and improve noise performance.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a clock generation circuit for generating clock signals having a second duty cycle comprises a first output terminal, a first input terminal coupled to a first clock having a first duty cycle, and a second input terminal coupled to a second clock having the first duty cycle, wherein the second clock lags the first clock by 90 degrees in phase. The clock generation circuit further comprises a first pull-down path coupled to the first input terminal, the second input terminal, and the first output terminal and configured to couple the first output terminal to a ground when the first clock and the second clock both are at logic high and decouple the first output terminal from the ground when at least one of the first clock and the second clock is at logic low. The clock generation circuit also comprises a first pull-up path coupled to the first input terminal and the first output terminal and configured to couple a supply voltage to the first output terminal when the first clock is at logic low and decouple the supply voltage from the first output terminal when the first clock is at logic high.

In another aspect, a clock generation circuit comprises a plurality of NAND gates each including a first input terminal, a second input terminal, an output terminal, a first NMOS transistor having the drain of the first NMOS transistor coupled to the output terminal, a second NMOS transistor having the drain of the second NMOS transistor coupled to the source of the first NMOS transistor and the source of the second NMOS transistor coupled to a ground, wherein the gates of the first NMOS transistor and the second NMOS transistor each couples to one of the first and second input terminals, and a PMOS transistor having the source of the PMOS transistor coupled to a supply voltage, the drain of the PMOS transistor coupled to the output terminal, and the gate of the PMOS transistor coupled to the first input terminal. The output terminal and the supply voltage is configured to be decoupled when the PMOS transistor is turned off.

In another aspect, a method comprises providing a first clock having a first duty cycle, providing a second clock having the first duty cycle, wherein the second clock lags the first clock by 90 degrees in phase. The method further comprises coupling a first output terminal to a ground when the first clock and the second clock both are at logic high and decoupling the first output terminal from the ground when at least one of the first clock and the second clock is at logic low, and coupling a supply voltage to the first output terminal when the first clock is at logic low and decoupling the supply voltage to the first output terminal when the first clock is at logic high.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

A crystal oscillator is one common type of local oscillator clock generator that provides good stability and performance at relatively low cost. Modern systems often use frequency synthesizers to obtain a stable tunable local oscillator. A frequency synthesizer is an electronic circuit that generates a range of frequencies from a single reference frequency. A frequency synthesizer may use the techniques of frequency multiplication, frequency division, direct digital synthesis, frequency mixing, and phase-locked loops to generate various frequencies. The clocks generated by either a crystal oscillator or a frequency synthesizer are typically at a 50% duty cycle. Yet often time, other duty cycles are needed to meet the design requirement.

Figure 1:
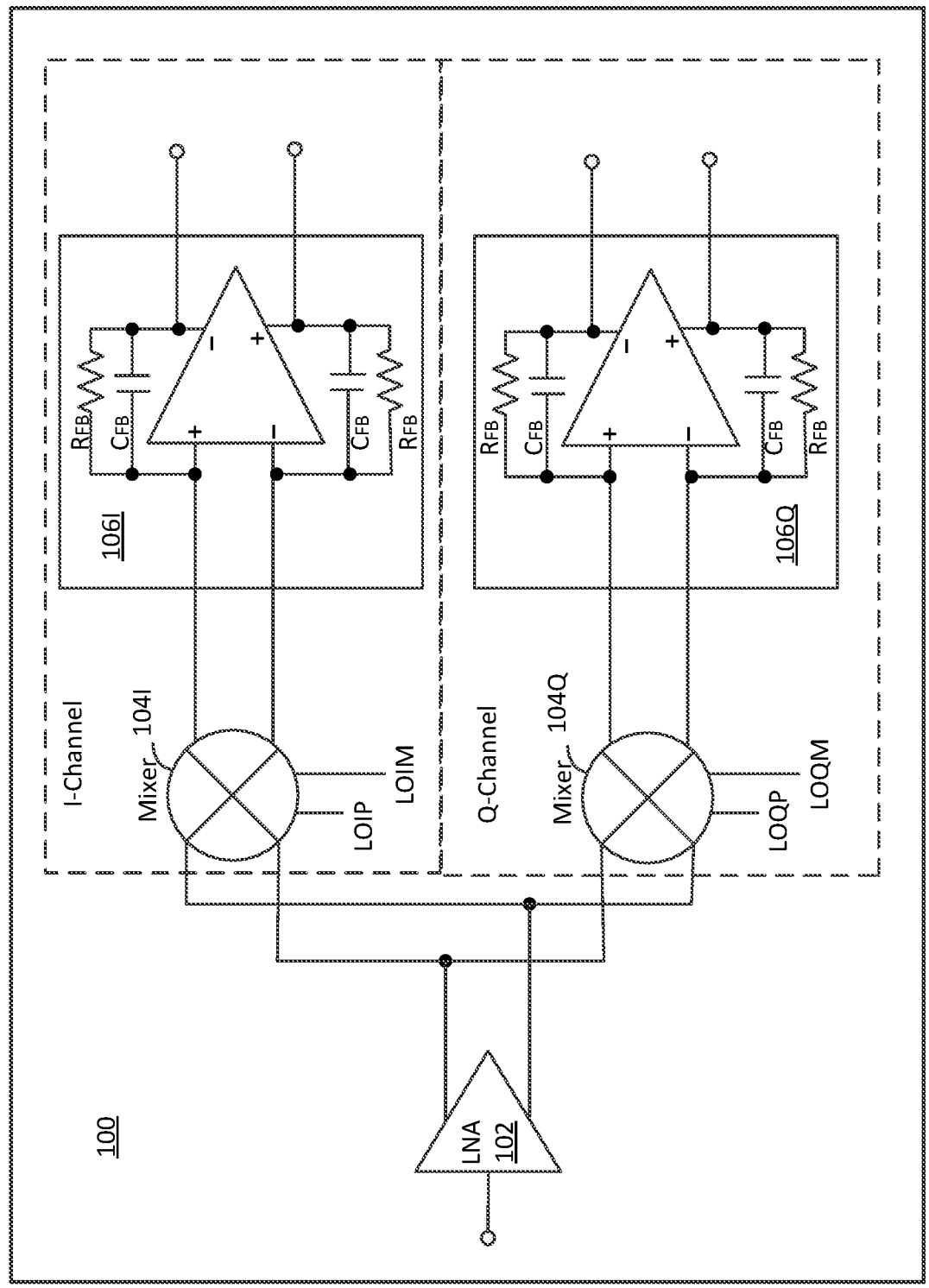
FIG. 1 illustrates an exemplary use of RF mixers according to certain aspects of the present disclosure.

FIG. 1 illustrates an exemplary use of RF mixers according to certain aspects of the present disclosure. A receiver 100 comprises a low noise amplifier (LNA) 102. The low noise amplifier (LNA) 102 amplifies an RF signal. The amplified RF signal couples to an I-Channel and a Q-Channel. The amplified RF signal is down-converted by an in-phase mixer 104I in the I-Channel and a quadrature-phase mixer 104Q in the Q-Channel to zero intermediate frequency (ZIF) or intermediate frequency (IF) signals. The in-phase mixer 104I is driven by differential in-phase local oscillator clocks LOIP and LOIM, while the quadrature-phase mixer 104Q is driven by differential quadrature-phase local oscillator clocks LOQP and LOQM with a 90-degree phase offset from the respective differential in-phase local oscillator clocks LOIP and LOIM. Typically, the differential local oscillator clocks have a duty cycle of 25% to reduce coupling between the I-Channel and the Q-Channel. The down-converted signals couple to respective operational trans-conductance amplifier (OTA) RC filters 106I and 106Q before coupling to a baseband processor (not shown).

Figure 2:
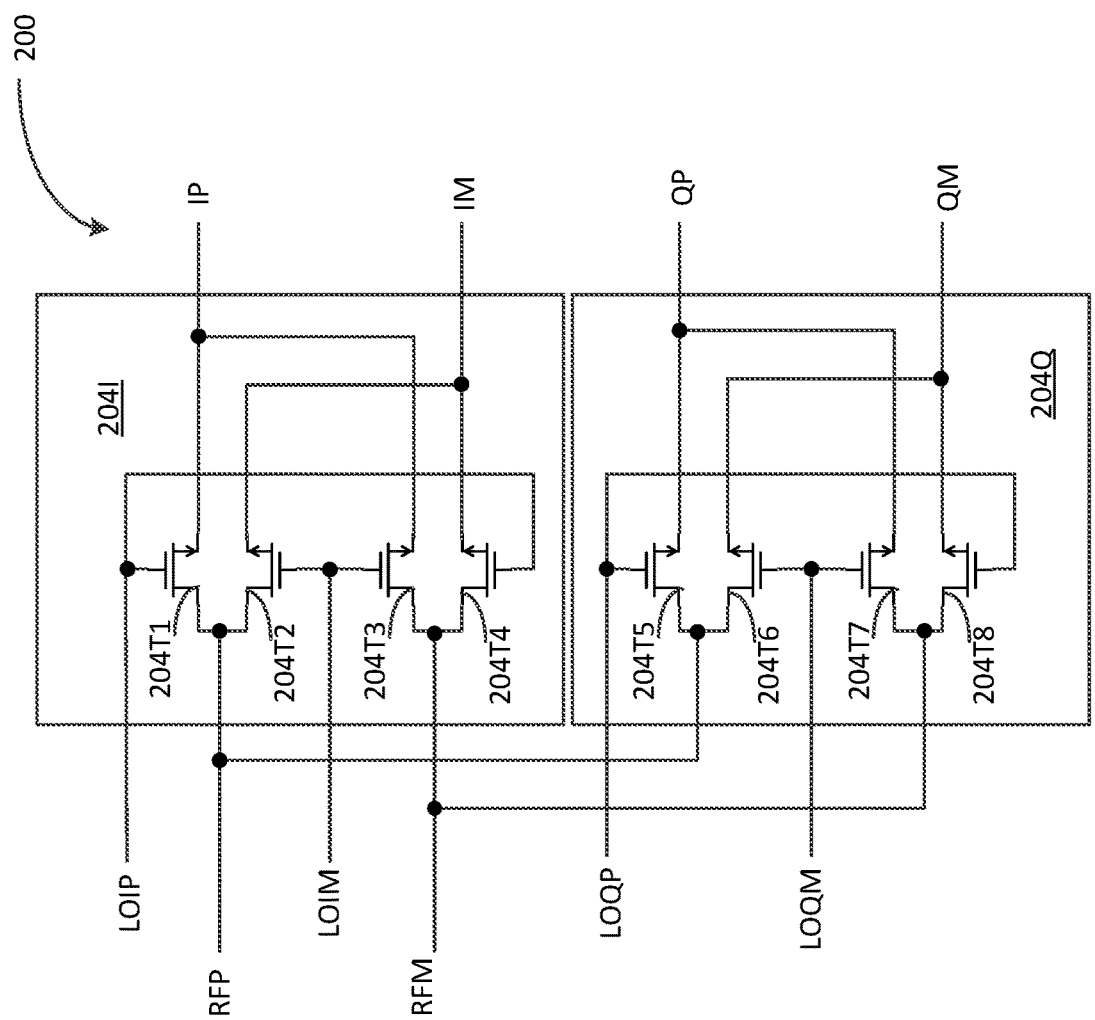
FIG. 2 illustrates an exemplary implementation of both in-phase and quadrature-phase mixers according to certain aspects of the present disclosure.

FIG. 2 illustrates an exemplary implementation of both in-phase and quadrature-phase mixers according to certain aspects of the present disclosure. The implementation 200 comprises an in-phase mixer 204I and a quadrature-phase mixer 204Q. The in-phase mixer 204I comprises NMOS transistors 204T1, 204T2, 204T2, and 204T4. The quadrature-phase mixer 204Q comprises NMOS transistors 204T5, 204T6, 204T7, and 204T8. Differential RF input signals, RFP and RFM, are mixed with differential local oscillator clocks, LOIP and LOIM, in the in-phase mixer 204I. The differential RF input signals, RFP and RFM, are also mixed with complementary differential local oscillator clocks, LOQP and LOQM, in the quadrature-phase mixer 204Q. The differential local oscillator clocks, LOIP and LOIM, are shifted 180 degrees in phase relative to one another, as are the differential local oscillator clocks, LOQP and LOQM. Furthermore, the local oscillator clock LOQP is shifted 90 degrees in phase relative to the local oscillator clock LOIP, and the local oscillator clock LOQM is shifted 90 degrees in phase relative to the local oscillator clock LOIM. The output of the in-phase mixer 204I and the quadrature-phase mixer 204Q are the in-phase differential baseband signals IP and IM and the quadrature-phase differential baseband signals QP and QM.

Figure 3:
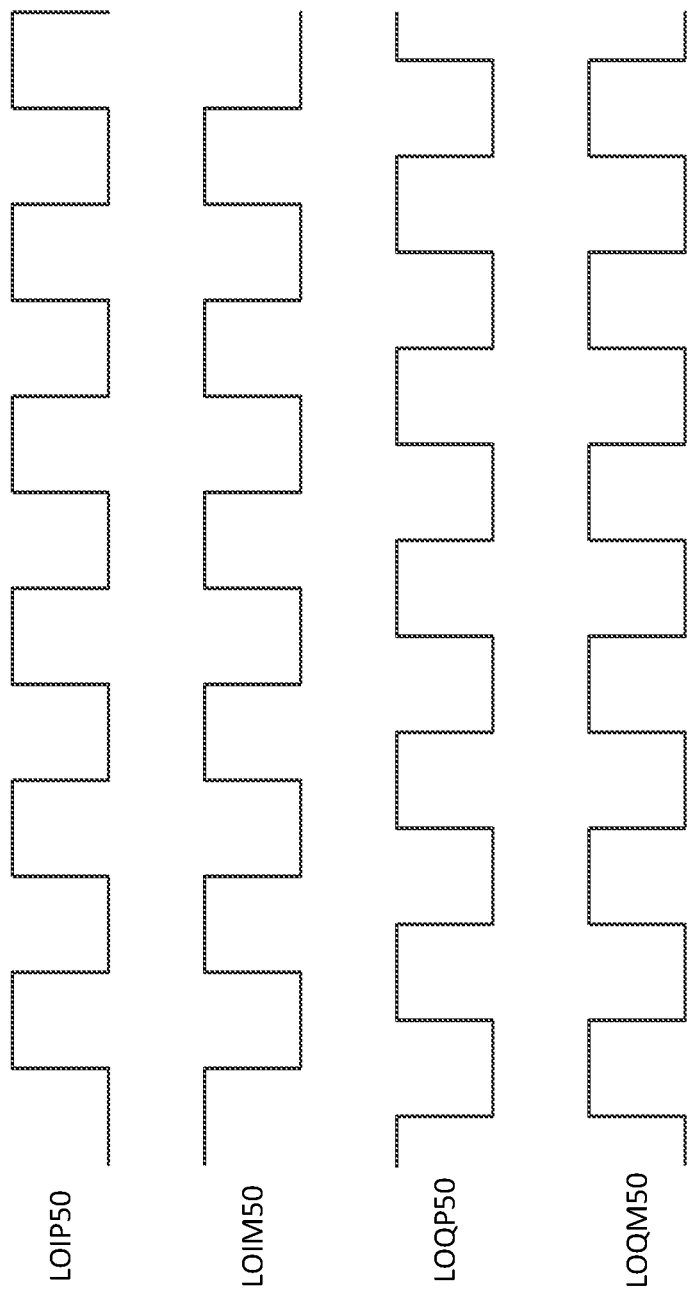
FIG. 3 illustrates an exemplary waveforms of local oscillator clocks with 50% duty cycle accordingly to certain aspects of the present disclosure.

The local oscillator clocks LOIP, LOIM, LOQP, and LOQM are used by one or more mixers to change the frequency of an RF signal. FIG. 3 illustrates an exemplary waveforms of local oscillator clocks with 50% duty cycle according to certain aspects of the present disclosure. Differential local oscillator clocks, LOIP50 and LOIM50, represent 50% duty cycle local oscillator clocks for an in-phase mixer. Similarly, complementary differential local oscillator clocks, LOQP50 and LOQM50, represent 50% duty cycle local oscillator clocks for a quadrature-phase mixer. The local oscillator clocks LOIP50, LOIM50, LOQP50, and LOQM50 all have a same clock frequency.

However, the differential local oscillator clocks, LOIP50 and LOIM50, are shifted 180 degrees in phase relative to one another, as are the differential local oscillator clocks, LOQP50 and LOQM50. Furthermore, the local oscillator clock LOQP50 is shifted 90 degrees in phase relative to the local oscillator clock LOIP50, and the local oscillator clock LOQM50 is shifted 90 degrees in phase relative to the local oscillator clock LOIM50. Overall, the local oscillator clock LOQP50 lags the local oscillator clock LOIP50 by 90 degrees in phase, the local oscillator clock LOIM50 lags the local oscillator clock LOQP50 by 90 degrees in phase, the local oscillator clock LOQM50 lags the local oscillator clock LOIM50 by 90 degrees in phase, and the local oscillator clock LOIP50 lags the local oscillator clock LOQM50 by 90 degrees in phase.

At 50% duty cycle, the local oscillator clock LOIP50 is at high 50% of the time and the local oscillator clock LOIM50 is at high for another 50% of the time. Similarly, the local oscillator clock LOQP50 is at high 50% of the time and the local oscillator clock LOQM50 is at high for another 50% of the time. When such local oscillator clocks are applied to the in-phase mixer 204I and the quadrature-phase mixer 204Q, respectively, the in-phase mixer 204I and the quadrature-phase mixer 204Q will both be on simultaneously. That is, when the duty cycle of the local oscillator clocks is at 50%, at any given time, the local oscillator clocks applied to the in-phase mixer 204I and the quadrature-phase mixer 204Q may be at logic high at the same time. As a result, some of the transistors 204T1, 204T2, 204T3, and 204T4 in the in-phase mixer 204I and some of the transistors 204T5, 204T6, 204T7, and 204T8 in the quadrature-phase mixer 204Q may turn on simultaneously. Thus, the signals in I-Channel and Q-Channel may cross over each other's path. Therefore, less than 50% duty cycle local oscillator clocks are desirable.

Figure 4:
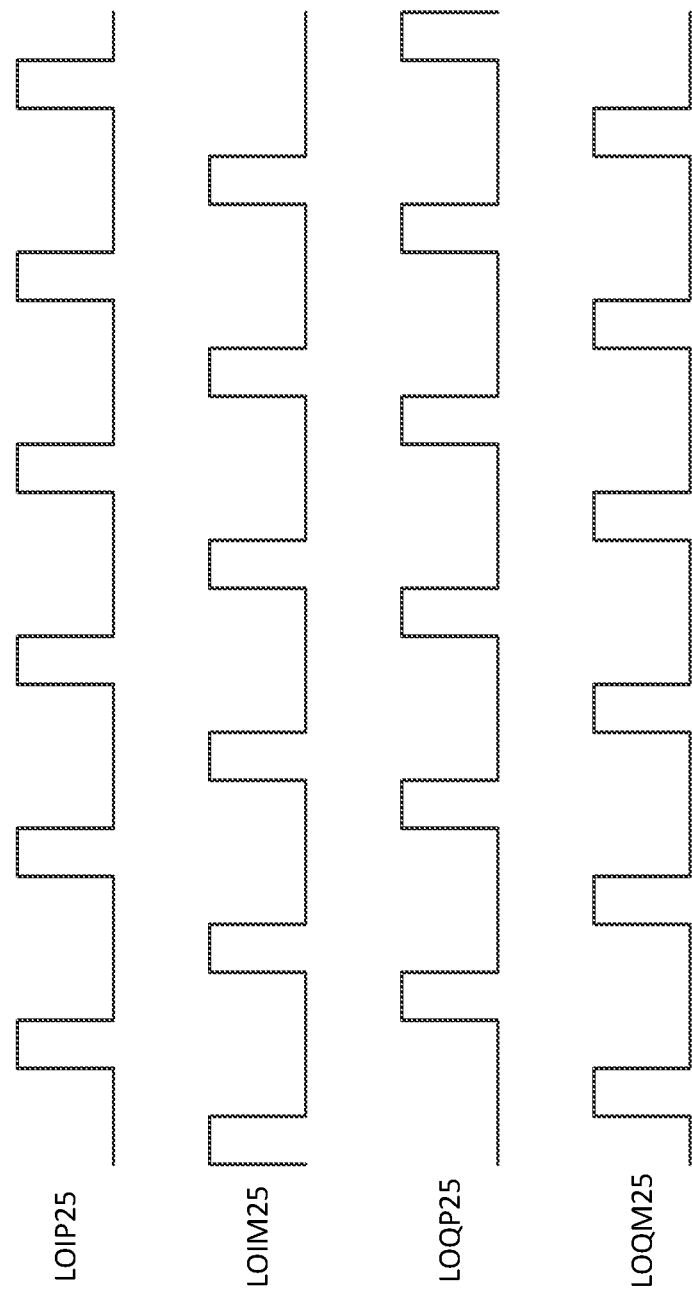
FIG. 4 illustrates an exemplary waveforms of local oscillator clocks with 25% duty cycle according to certain aspects of the present disclosure.

FIG. 4 illustrates an exemplary waveforms of local oscillator clocks with 25% duty cycle according to certain aspects of the present disclosure. Differential local oscillator clocks, LOIP25 and LOIM25, serve as the 25% duty cycle local oscillator clocks to an in-phase mixer. Likewise, complementary differential local oscillator clocks, LOQP25 and LOQM25, serve as the 25% duty cycle local oscillator clocks to a quadrature-phase mixer. The local oscillator clocks LOIP25, LOIM25, LOQP25, and LOQM25 all have a same clock frequency. The differential local oscillator clocks, LOIP25 and LOIM25, are shifted 180 degrees in phase relative to one another, as are the differential local oscillator clocks, LOQP25 and LOQM25. Furthermore, the local oscillator clock LOQP25 is shifted 90 degrees in phase relative to the local oscillator clock LOIP25, and the local oscillator clock LOQM25 is shifted 90 degrees in phase relative to the local oscillator clock LOIM25.

When the local oscillator clocks' duty cycle approaches 25%, the in-phase mixer and the quadrature-phase mixer on-time overlap may be insignificant if the rise-time and fall-time of the local oscillator clocks are sufficiently small. Therefore, there is a desire to generate and use 25% duty cycle local oscillator clocks.

Figure 5:
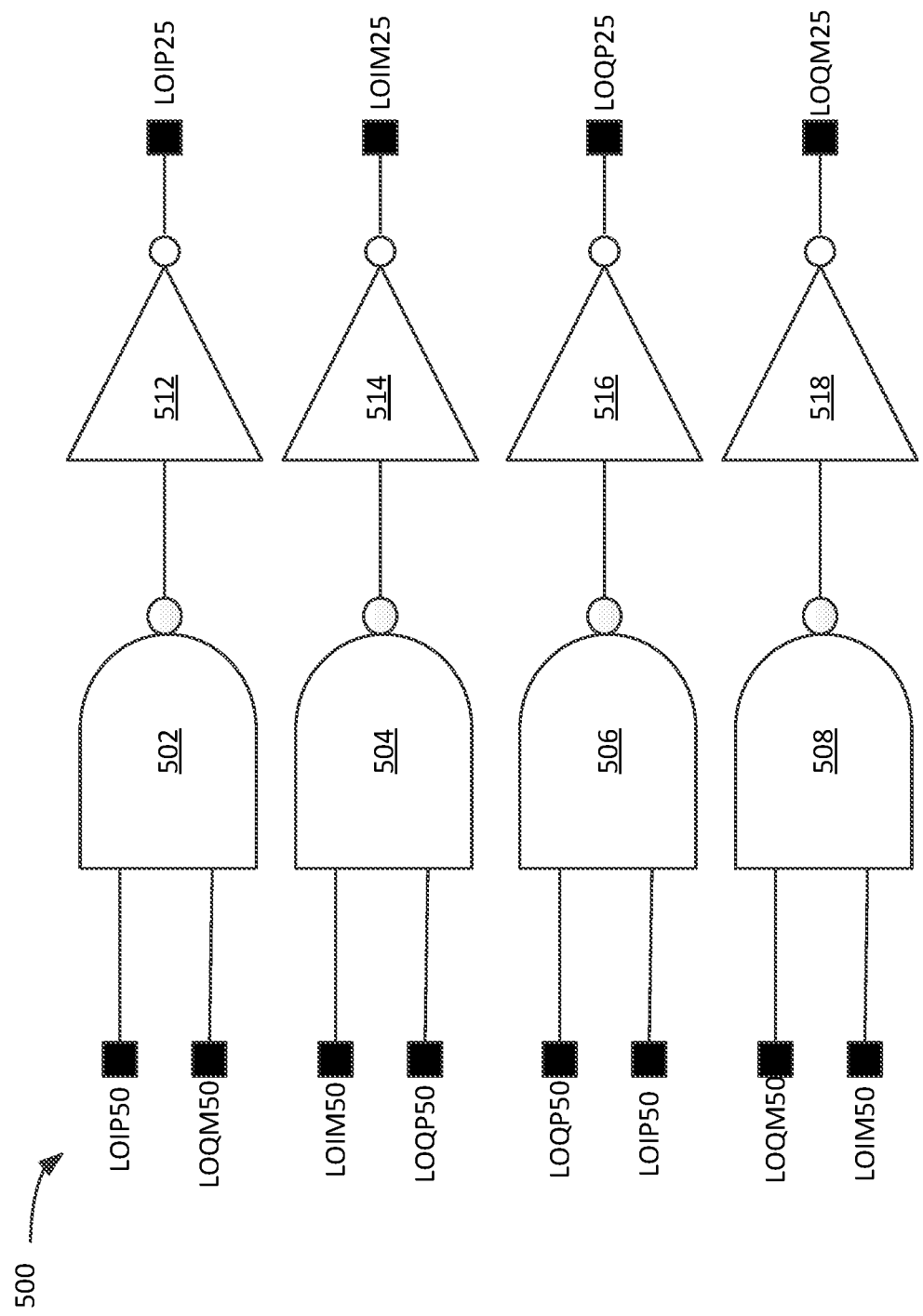
FIG. 5 illustrates an exemplary circuit of 25% duty cycle local oscillator clock generation according to certain aspects of the present disclosure.

25% duty cycle local oscillator clocks may be generated from 50% duty cycle local oscillator clocks. FIG. 5 illustrates an exemplary implementation of 25% duty cycle local oscillator clock generation according to certain aspects of the present disclosure. The circuit 500 comprises four NAND-Inverter pairs: NAND gate 502 and Inverter 512, NAND gate 504 and Inverter 514, NAND gate 506 and Inverter 516, and NAND gate 508 and Inverter 518. Each NAND-Inverter pair receives 50% duty cycle local oscillator clocks (LOIP50, LOIM50, LOQP50, and LOQM50) and outputs 25% duty cycle local oscillator clocks, LOIP25, LOIM25, LOQP25, and LOQM25. For example, The NAND-Inverter pair, NAND gate 502 and Inverter 512, receives the local oscillator clocks LOIP50 and LOQM50 and generates 25% duty cycle local oscillator clock LOIP25; the NAND-Inverter pair, NAND gate 504 and Inverter 514, receives the local oscillator clocks LOIM50 and LOQP50 and generates 25% duty cycle local oscillator clock LOIM25; the NAND-Inverter pair, NAND gate 506 and Inverter 516 receives the local oscillator clocks LOQP50 and LOIP50 and generates 25% duty cycle local oscillator clock LOQP25; and the NAND-Inverter pair, NAND gate 508 and Inverter 518, receives the local oscillator clocks LOQM50 and LOIM50 and generates 25% duty cycle local oscillator clock LOQM25. Each of the NAND-Inverter pairs functions as logical AND. The logic AND operation of the local oscillator clocks LOQM50 and LOIP50 generates the local oscillator clock LOIP25. Since the local oscillator clocks LOQM50 and LOIP50 are at logic high simultaneously 25% of the time, the resulting local oscillator clock LOIP25 has 25% duty cycle. Similarly, the logic AND operation of the local oscillator clocks LOIM50 and LOQP50 generates the local oscillator clock LOIM25 having 25% duty cycle; the logic AND operation of the local oscillator clocks LOQP50 and LOIP50 generates the local oscillator clock LOQP25 having 25% duty cycle, and the logic AND operation of the local oscillator clocks LOQM50 and LOIM50 generates the local oscillator clock LOQM25 having 25% duty cycle.

Figure 6:
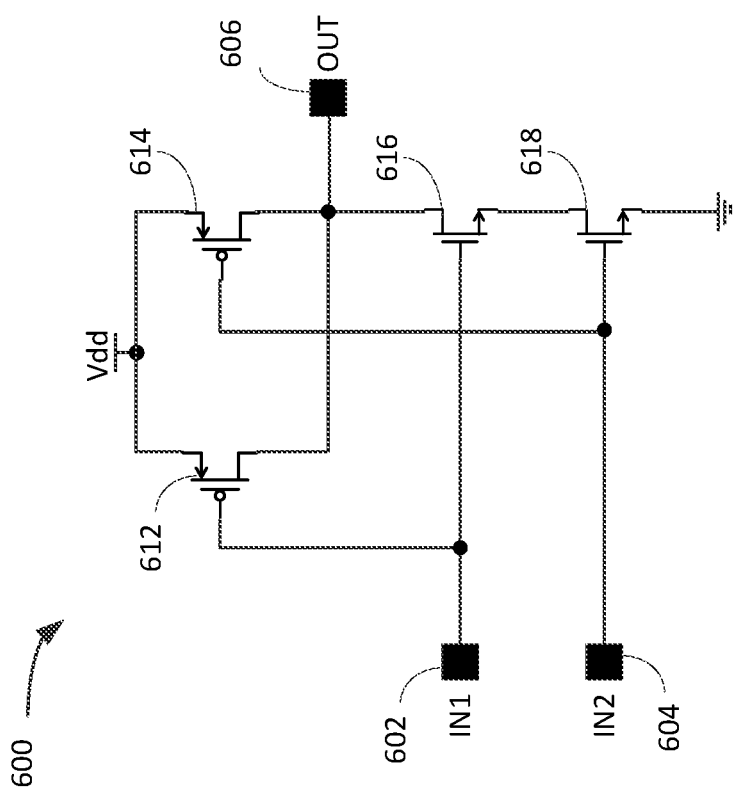
FIG. 6 illustrates an exemplary NAND gate CMOS circuit according to certain aspects of the present disclosure.

FIG. 6 illustrates an exemplary implementation of a NAND gate CMOS circuit according to certain aspects of the present disclosure. The NAND gate 600 comprises two inputs, IN1 602 and IN2 604, and an output OUT 606. The NAND gate 600 is implemented in conventional CMOS logic and comprises two parallel PMOS transistors 612 and 614 configured as a pull-up path. Both sources of the PMOS transistors 612 and 614 couple to a power supply Vdd and both drains of the PMOS transistors 612 and 614 couple to the output OUT 606. The gates of the PMOS transistors 612 and 614 couple to the inputs IN1 602 and IN2 604, respectively. The NAND gate 600 further comprises two serially connected NMOS transistors 616 and 618 configured as a pull-down path. The drain of the NMOS transistor 616 couples to the output OUT 604. The source of the NMOS transistor 616 and the drain of the NMOS transistor 618 are electrically coupled. The source of the NMOS transistor 618 couples to a ground. The gates of the NMOS transistors 616 and 618 couple to the inputs IN1 602 and IN2 604, respectively. Because the parallel PMOS transistors 612 and 614, the output OUT 606 may couple to the supply voltage Vdd through either of or both the PMOS transistors 612 and 614. The output OUT 606 may be decoupled from the supply voltage Vdd when both the PMOS transistors 612 and 614 are off.

Figure 7:
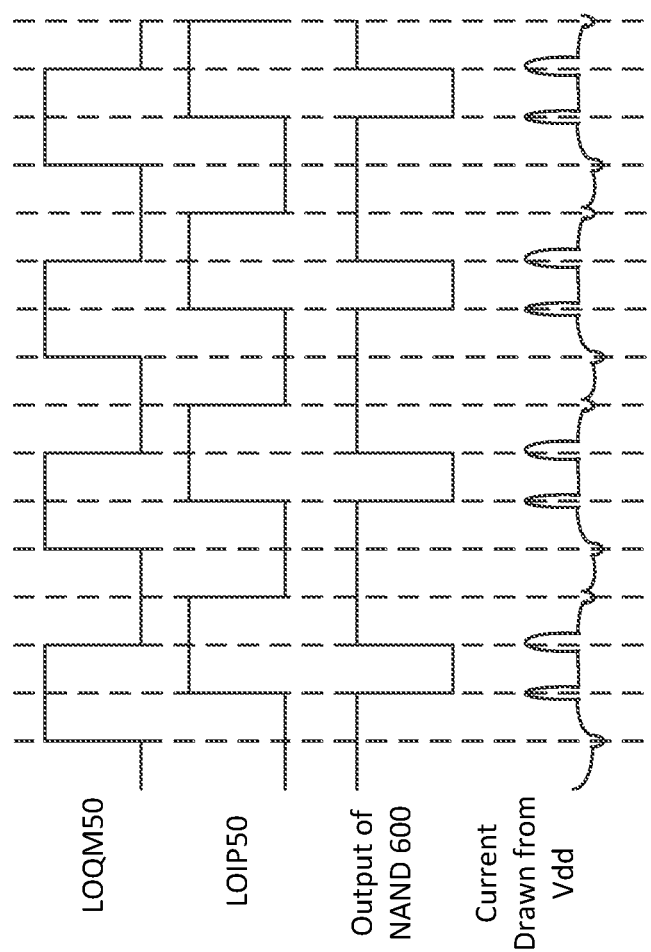
FIG. 7 illustrates an exemplary current drawn by a NAND gate for generating 25% duty cycle local oscillator clock using 50% duty cycle local oscillator clocks according to certain aspects of the present disclosure.

The NAND gate 600 design suffers from high current consumption. For every transition at the output of the NAND gate 600, either from low to high or from high to low, there will be significant short circuit current flowing from the supply voltage Vdd to the ground, as the input signals have finite transition time. FIG. 7 illustrates an exemplary current drawn by the NAND gate 502 when generating a 25% duty cycle local oscillator clock using 50% duty cycle local oscillator clocks according to certain aspects of the present disclosure. The NAND gate 502 adopts the NAND gate 600 design. The NAND gate 502 has two inputs with 50% duty cycle local oscillator clocks: LOQM50 and LOIP50, and an output of 25% duty cycle local oscillator clock, LOIP25. Because of finite transition time, there is a period that both the pull-up and pull-down paths are on simultaneously, causing significant short circuit current. Significant current spike happens when the output of NAND gate 502 transitions from logic high to low or low to high.

In addition, the NAND gate 600, when used as the NAND gates 502, 504, 506, and 508, creates a heavy load to the local oscillator clocks LOIP50, LOIM50, LOQP50, and LOQM50. Each of the local oscillator clocks LOIP50, LOIM50, LOQP50, and LOQM50 drives 4 transistors. As shown in FIG. 5, each of the local oscillator clocks LOIP50, LOIM50, LOQP50, and LOQM50 couples to two NAND gates. For example, the local oscillator clock LOIP50 couples to the NAND gates 502 and 506; the local oscillator clock LOIM50 couples to the NAND gates 504 and 508; the local oscillator clock LOQP50 couples to the NAND gates 504 and 506; and the local oscillator clock LOQM50 couples to the NAND gates 502 and 508. Inside the NAND gates (the NAND gate 600), each input local oscillator clock couples to two transistors, one pull-up PMOS and one pull-down NMOS.

Furthermore, the NAND gate 600 has a potentially high mismatch between pull-up and pull-down paths. As pull-down path has two NMOS in series and pull-up path has two PMOS transistor in parallel, the structure is asymmetrical by design.

Figure 8:
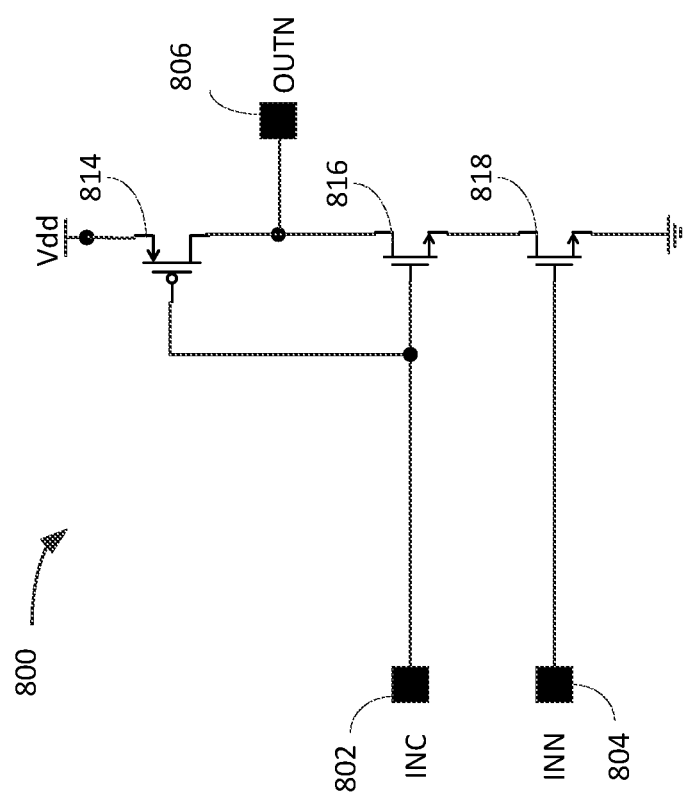
FIG. 8 illustrates another exemplary NAND gate CMOS circuit according to certain aspects of the present disclosure.

FIG. 8 illustrates an exemplary NAND gate CMOS circuit according to certain aspects of the present disclosure. Like the NAND gate 600, the NAND gate 800 comprises two inputs, INC 802 and INN 804, and an output OUTN 806. The input INC 802 couples to the gates of an NMOS transistor 816 and a PMOS transistor 814 while the input INN 804 couples to the gate of an NMOS transistor 818. The source of the PMOS transistor 814 couples to the supply voltage Vdd and the drain couples to the output OUTN 806. The drain of the NMOS transistor 816 couples to the output OUTN 806 and the source couples to the drain of the NMOS transistor 818. The source of the NMOS transistor 818 couples to the ground. Different to the NAND gate 600, the input INN 804 does not couple to a PMOS transistor. As a result, the NAND gate 800 has 3 transistors instead of 4.

The pull-down path of the NAND gate 800 comprises two serially connected NMOS transistors 816 and 818. The pull-up path comprises one PMOS transistor 814. The pull-up path couples only to one input, INC 802, while the pull-down path couples to both inputs, INC 802 and INN 804. The pull-down path is configured to couple the output OUTN 806 to the ground when the signals coupled to the inputs, INC 802 and INN 804, are both at logic high and decouple the output OUN 806 from the ground when at least one of the signals coupled to the input, INC 802 and INN 804, is at logic low. The pull-up path is configured to couple the supply voltage Vdd to the output OUTN 806 when the signal to the input INC 802 is at logic low and decouple the supply voltage Vdd from the output OUTN 806 when the signal to the input INC 802 is at logic high. The logic state of the signal to the input INN 804 does not affect the coupling of the output OUTN 806 and the supply voltage Vdd.

Figure 9:
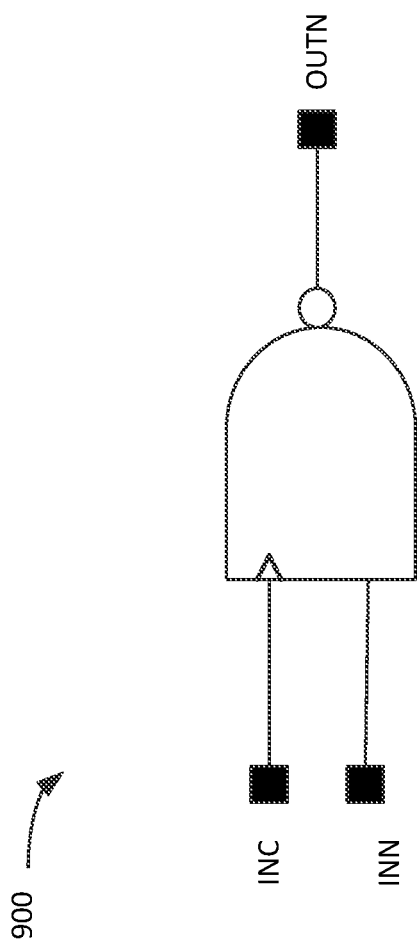
FIG. 9 illustrates an exemplary NAND gate schematic symbol according to certain aspects of the present disclosure.

The two inputs of NAND gate 800, INC 802 and INN 804, have asymmetric loading. The input INC 802 couples to both the pull-up path PMOS transistor 814 and the pull-down path NMOS transistor 816. The input INN 804, however, only couples to the pull-down path NMOS transistor 816. To denote such a difference, an NAND gate schematic symbol is created for such a configuration and is illustrated in FIG. 9. In FIG. 9, the input INC of FIG. 8 is denoted with an arrow in the NAND gate symbol 900.

Figure 10:
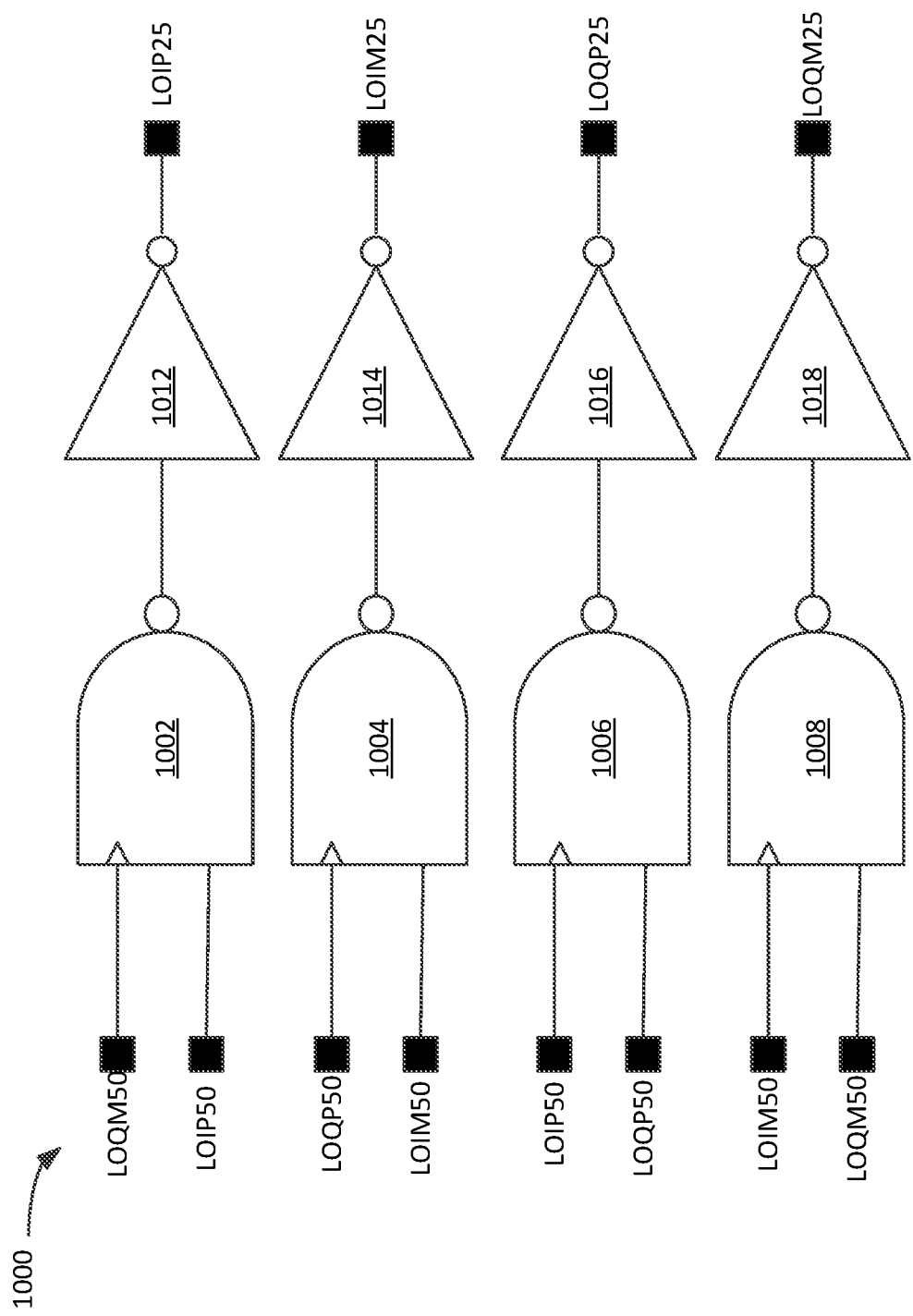
FIG. 10 illustrates another exemplary circuit of 25% duty cycle local oscillator clock generation according to certain aspects of the present disclosure.

FIG. 10 illustrates an exemplary implementation of 25% duty cycle local oscillator clock generation according to certain aspects of the present disclosure. The circuit 1000 comprises four NAND-Inverter pairs: NAND gate 1002 and Inverter 1012, NAND gate 1004 and Inverter 1014, NAND gate 1006 and Inverter 1016, and NAND gate 1008 and Inverter 1018. Each NAND-Inverter pairs receives 50% duty cycle local oscillator clocks, LOIP50, LOIM50, LOQP50, and LOQM50, and outputs 25% duty cycle local oscillators, LOIP25, LOIM25, LOQP25, and LOQM25. For example, The NAND-Inverter pair, NAND gate 1002 and Inverter 1012, receives 50% duty cycle local oscillator clocks LOIP50 and LOQM50 and generates 25% duty cycle local oscillator clock LOIP25; the NAND-Inverter pair, NAND gate 1004 and Inverter 1014, receives 50% duty cycle local oscillator clocks LOIM50 and LOQP50 and generates 25% duty cycle local oscillator clock LOIM25; the NAND-Inverter pair, NAND gate 1006 and Inverter 1016, receives 50% duty cycle local oscillator clocks LOQP50 and LOIP50 and generates 25% duty cycle local oscillator clock LOQP25; and the NAND-Inverter pair, NAND gate 1008 and Inverter 1018, receives 50% duty cycle local oscillator clock LOQM50 and LOIM50 and generates 25% duty cycle local oscillator clocks LOQM25. Each of the NAND gates 1002, 1004, 1006, and 1008 uses the design of NAND gate 800 in FIG. 8 and is illustrated with the NAND gate schematic symbol 900.

Refer back to FIG. 8. Because of the asymmetric nature of two inputs, INC 802 and INN 804, for the NAND gate 800 to have proper logic NAND operation on signals from the two inputs, INC 802 and INN 804, the local oscillator clock to the input terminal INN must lag the local oscillator clock to the input terminal INC. The input signals to the circuit 1000 in FIG. 10 reflects such a relationship. For example, in the NAND gate 1002, the local oscillator clock LOQM50 couples to the input terminal INC while the local oscillator clock LOIP50 couples to the input terminal INN as the local oscillator clock LOIP50 lags the local oscillator LOQM50 by 90 degrees in phase. For ease of explanation, the local oscillator clock LOQM50 for the NAND gate 1002 is referred to as the leading local oscillator clock while the local oscillator clock LOIP50 for the NAND gate 1002 is referred to as the lagging local oscillator clock. Similarly, the local oscillator clock LOQP50 couples to the input terminal INC while the local oscillator clock LOIM50 couples to the input terminal INN for the NAND gate 1004 as the local oscillator clock LOIM50 lags the local oscillator LOQP50 by 90 degrees in phase. Thus, for the NAND gate 1004, the leading local oscillator clock is the local oscillator clock LOQP50 and the lagging local oscillator clock is the local oscillator clock LOIM50. The local oscillator clock LOIP50 couples to the input terminal INC while the local oscillator clock LOQP50 couples to the input terminal INN for the NAND gate 1006 as the local oscillator clock LOQP50 lags the local oscillator LOIP50 by 90 degree in phase. For the NAND gate 1006, the leading local oscillator clock is the local oscillator clock LOIP50 and the lagging local oscillator clock is the local oscillator clock LOQP50. The local oscillator clock LOIM50 couples to the input terminal INC while the local oscillator clock LOQM50 couples to the input terminal INN for the NAND gate 1008 as the local oscillator clock LOQM50 lags the local oscillator LOIM50 by 90 degrees in phase. For the NAND gate 1008, the leading local oscillator clock is the local oscillator clock LOIM50 and the lagging local oscillator clock is the local oscillator clock LOQM50.

Such a design is possible for the NAND gates 1002, 1004, 1006, and 1008 since the two input signals to each of the NAND gates 1002, 1004, 1006, and 1008 have certain relationship. The pull-up PMOS for the lagging local oscillator clock is not needed. When the lagging local oscillator clock goes from logic high to low, the leading local oscillator clock is already at logic low and remains low, keeping the pull-down path of the corresponding one of the NAND gates 1002, 1004, 1006, and 1008 off, hence the output of the corresponding NAND gate 1002, 1004, 1006, or 1008 holds the previous state at logic high without a need for a pull-up path to be on.

Figure 11:
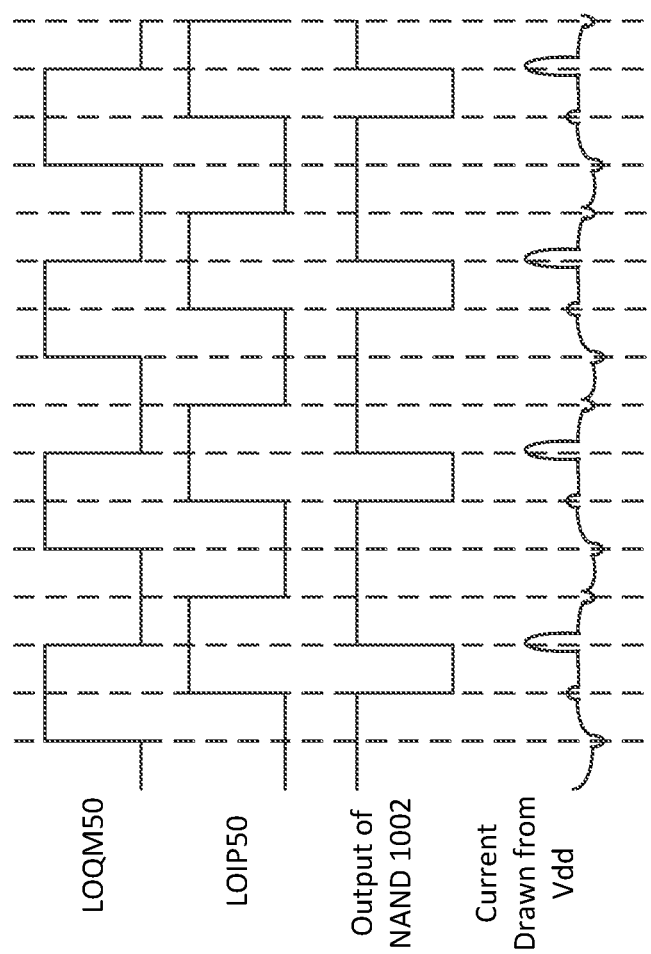
FIG. 11 illustrates another exemplary current drawn by a NAND gate for generating 25% duty cycle local oscillator clock using 50% duty cycle local oscillator clocks according to certain aspects of the present disclosure.

By eliminating the pull-up PMOS for the lagging local oscillator clock, the short circuit current during the logic high to low transition of the NAND gate output is reduced, as illustrated in FIG. 11. FIG. 11 illustrates the current drawn by the NAND gate 1002 for generating the local oscillator clock LOIP25 using 50% duty cycle local oscillator clocks LOQM50 and LOIP50 according to certain aspects of the present disclosure. The output of the NAND gate 1002 transitioning from logic high to low when the lagging local oscillator clock LOIP50 transitions from logic low to high. Because the leading local oscillator LOQM50 has turned off the pull-up path before the transition of lagging local oscillator clock LOIP50, there is insignificant short circuit current drawn.

By eliminating the pull-up PMOS for the lagging local oscillator clock, the load to the 50% duty cycle local oscillators clocks LOIP50, LOIM50, LOQP50, and LOQM50 is also reduced. Each of the local oscillators clocks LOIP50, LOIM50, LOQP50, and LOQM50 drives only 3 transistors in the circuit 1000 using NAND gates 800 compared to 4 transistors in the circuit 500 using NAND gates 600. In addition, the symmetry between pull-up and pull-down paths is improved.

Although FIG. 10 illustrates an application of NAND gate 800 for 25% duty cycle local oscillator clock generation using 50% duty cycle local oscillator clocks, other alternative applications are possible, including using less than or more than 4 NAND gates 800 and including input signals other than 50% duty cycle local oscillator clocks.

Figure 12:
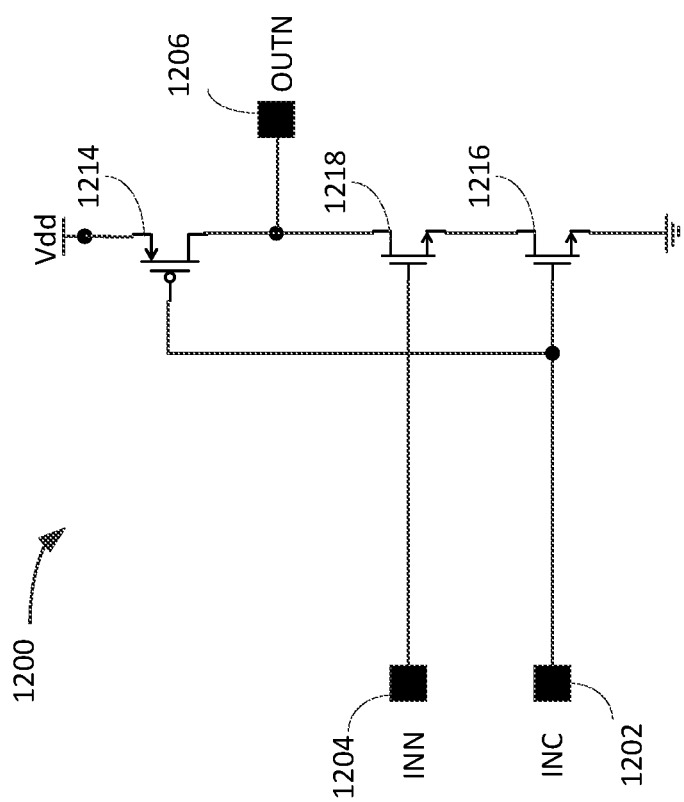
FIG. 12 illustrates an alternative NAND gate CMOS circuit according to certain aspects of the present disclosure.

FIG. 12 illustrates an alternative NAND gate CMOS circuit according to certain aspects of the present disclosure. Like the NAND gate 800, the NAND gate 1200 comprises two inputs, INC 1202 and INN 1204, and an output OUTN 1204. The input INC 1202 couples to the gates of an NMOS transistor 1216 and a PMOS transistor 1214. However, the input INN 1204 couples only to the gate of an NMOS transistor 1218. The PMOS transistor 1214 has the source coupled to the supply voltage Vdd and the drain coupled to the output OUTN 1214. The NMOS transistor 1216 has the source coupled to the ground and the drain coupled to the source of the NMOS transistor 1218. The drain of the NMOS transistor 1218 couples to the output OUTN 1214. Like the NAND gate 800, when the NAND gate 1200 is used for the NAND gates 1002, 1004, 1006, and 1008 in circuit 1000, the input INC 1202 couples to a leading local oscillator clock while the input INN 1203 couples to a lagging local oscillator clock.

Figure 13:
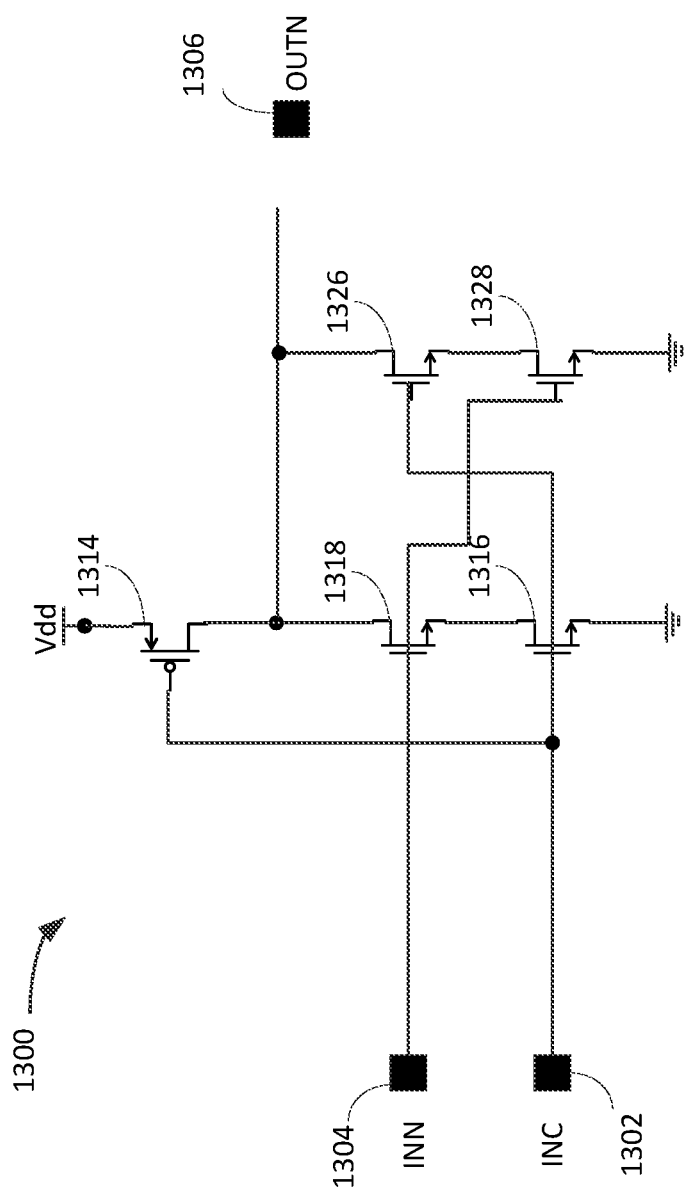
FIG. 13 illustrates yet another alternative NAND gate CMOS circuit according to certain aspects of the present disclosure.

FIG. 13 illustrates yet another alternative NAND gate CMOS circuit according to certain aspects of the present disclosure. The NAND gate 1300 comprises two inputs, INC 1302 and INN 1304, and an output OUTN 1304. The input INC 1302 couples to the gates of an NMOS transistor 1316 and a PMOS transistor 1314. The input INN 1304 couples to the gate of an NMOS transistor 1318 but not to other PMOS transistor. The PMOS transistor 1314 has the source coupled to the supply voltage Vdd and the drain coupled to the output OUTN 1314. The NMOS transistor 1316 has the source coupled to the ground and the drain coupled to the source of the NMOS transistor 1318. The drain of the NMOS transistor 1318 couples to the output OUTN 1314. Like the NAND gate 800, when the NAND gate 1300 is used for the NAND gates 1002, 1004, 1006, and 1008 in circuit 1000, the input INC 1302 couples to a lead local oscillator clock while the input INN 1303 couples to a lagging local oscillator clock.

In addition, the NAND gate 1300 further comprises a second pull-down path including NMOS transistors 1326 and 1328 in series. The drain of the NMOS transistor 1326 couples to the output OUTN 130, the source of the NMOS transistor 1326 couples to the drain of the NMOS transistor 1328, and the gate of the NMOS transistor 1326 couples to the input INC 1302. The source of the NMOS transistor 1328 couples to the ground while the gate of the NMOS transistor 1328 couples to the input INN 1304. Because of the dual pull-down paths (pull-down path by the NMOS transistor 1316 and 1318 and pull-down path by the NMOS transistor 1326 and 1328), the two input signals to the NAND gates 1300 have symmetric effect in pulling the output OUTN to the ground.

Figure 14:
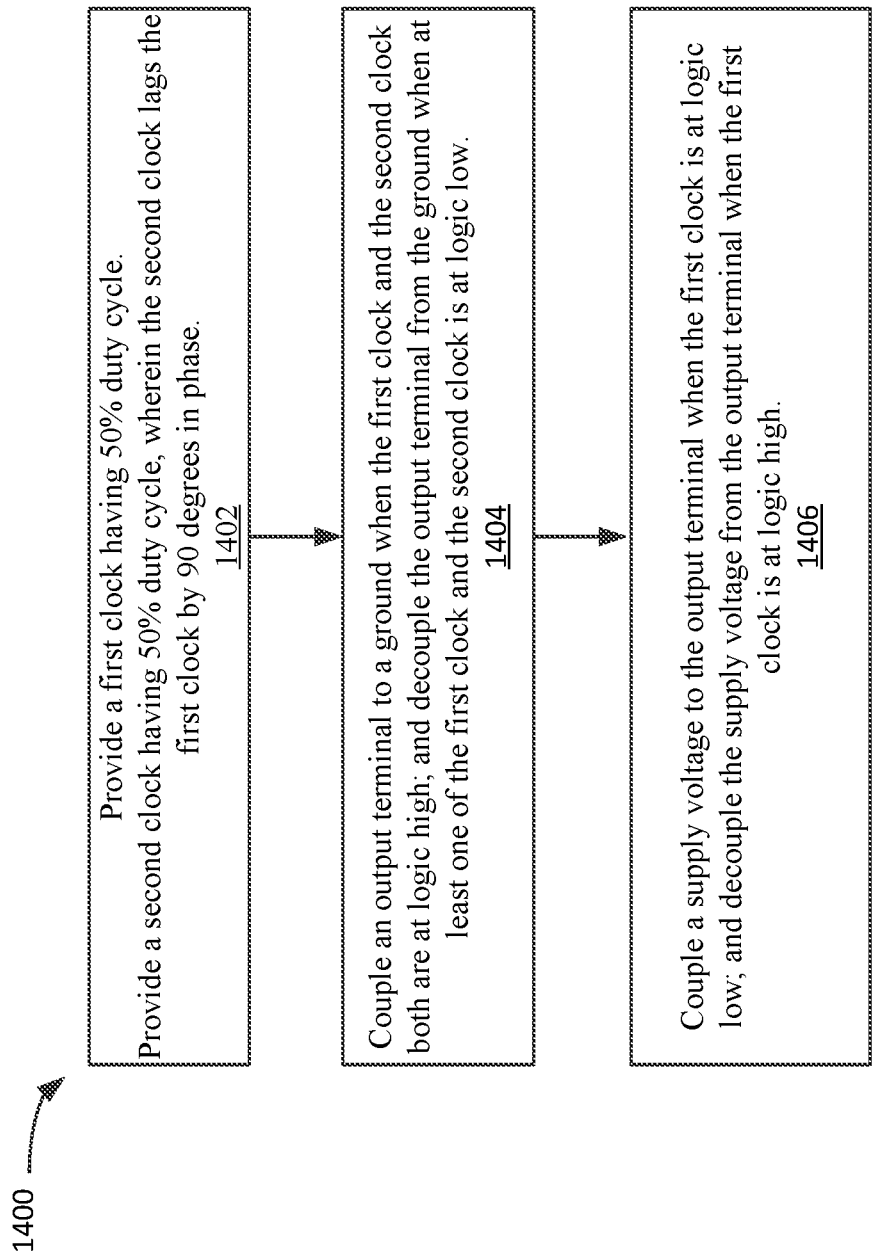
FIG. 14 illustrates an exemplary method of a logic NAND operation according to certain aspects of the present disclosure.

FIG. 14 illustrates an exemplary method 1400 of a logic NAND operation (e.g., by the NAND gate 800, 1200, or 1300) according to certain aspects of the present disclosure. At 1402, two 50% duty cycle clocks, a first clock and a second clock, are provided as the inputs. The two 50% duty cycle clocks have a same frequency but the second clock lags the first clock by 90 degrees in phase. At 1404, in response to the first and second clocks, couple an output terminal to a ground when the first clock and the second clock both are at logic high and decouple the output terminal from the ground when at least one of the first clock and the second clock is at logic low. At 1406, in response to the first clock, couple a supply voltage to the output terminal when the first clock is at logic low and decouple the supply voltage from the output terminal when the first clock is at logic high. The second clock does not affect the coupling of the output terminal to the supply voltage.

Figure 15:
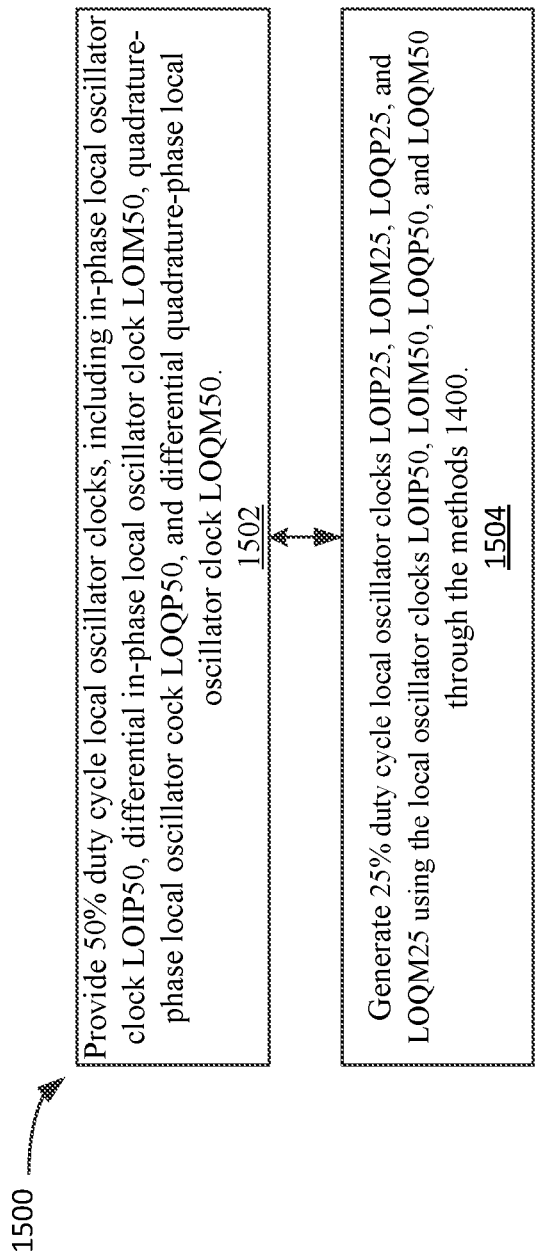
FIG. 15 illustrates an exemplary method of 25% duty cycle local oscillator clock generation using 50% duty cycle local oscillator clocks according to certain aspects of the present disclosure.

FIG. 15 illustrates an exemplary method 1500 of 25% duty cycle local oscillator clock generation using 50% duty cycle local oscillator clocks (e.g., by circuit 1000) according to certain aspects of the present disclosure. At 1502, 50% duty cycle local oscillator clocks, including in-phase local oscillator clock LOIP50, differential in-phase local oscillator clock LOIM50, quadrature-phase local oscillator cock LOQP50, and differential quadrature-phase local oscillator clock LOQM50, are provided. The 50% duty cycle local oscillator clocks LOIP50, LOIM50, LOQP50, and LOQM50 have a same clock frequency and all with a duty cycle of 50%. the local oscillator clock LOQP50 is shifted 90 degrees in phase relative to the local oscillator clock LOIP50, and the local oscillator clock LOQM50 is shifted 90 degrees in phase relative to the local oscillator clock LOIM50. Overall, the local oscillator clock LOQP50 lags the local oscillator clock LOIP50 by 90 degrees in phase, the local oscillator clock LOIM50 lags the local oscillator clock LOQP50 by 90 degrees in phase, the local oscillator clock LOQM50 lags the local oscillator clock LOIM50 by 90 degrees in phase, and the local oscillator clock LOIP50 lags the local oscillator clock LOQM50 by 90 degrees in phase.

At 1504, 25% duty cycle local oscillator clocks LOIP25, LOIM25, LOQP25, and LOQM25 are generated using the local oscillator clocks LOIP50, LOIM50, LOQP50, and LOQM50. The local oscillator clock LOIP25 is generated using the method 1400 with the local oscillator clock LOQM50 as the first clock and LOIP50 as the second clock; the local oscillator clock LOIM25 is generated using the method 1400 with the local oscillator clock LOQP50 as the first clock and LOIM50 as the second clock; the local oscillator clock LOQP25 is generated using the method 1400 with the local oscillator clock LOIP50 as the first clock and LOQP50 as the second clock; and the local oscillator clock LOQM25 is generated using the method 1400 with the local oscillator clock LOIM50 as the first clock and LOQM50 as the second clock.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A clock generation circuit for generating clock signals having a second duty cycle comprising a plurality of NAND gates each including:
   a first input terminal;
   a second input terminal;
   an output terminal;
   a first NMOS transistor having a drain of the first NMOS transistor coupled to the output terminal;
   a second NMOS transistor having a drain of the second NMOS transistor coupled to a source of the first NMOS transistor and a source of the second NMOS transistor coupled to a ground;
   a third NMOS transistor having a drain of the third NMOS transistor coupled to the output terminal;
   a fourth NMOS transistor having a drain of the fourth NMOS transistor coupled to a source of the third NMOS transistor and a source of the fourth NMOS transistor coupled to the ground, wherein a gate of the first NMOS transistor and a gate of the fourth NMOS transistor couple to the first input terminal and a gate of the second NMOS transistor and a gate of the third NMOS transistor couple to the second input terminal; and
   a PMOS transistor having a source of the PMOS transistor coupled to a supply voltage, a drain of the PMOS transistor coupled to the output terminal, and a gate of the PMOS transistor coupled to the first input terminal, wherein the output terminal and the supply voltage is configured to be decoupled when the PMOS transistor is turned off, wherein a logic state of a signal at the second input terminal does not affect the coupling of the first output terminal and the supply voltage.

2. The clock generation circuit of claim 1, wherein the first input terminal of first one of the plurality of NAND gates is configured to couple to a first clock having a first duty cycle, and the second input terminal of the first one of the plurality of NAND gates is configured to couple to a second clock having the first duty cycle, wherein the second clock lags the first clock by 90 degrees in phase.

3. The clock generation circuit of claim 2, wherein the first duty cycle is 50% and the second duty cycle is 25%.

4. The clock generation circuit of claim 2, wherein the first input terminal of second one of the plurality of NAND gates is configured to couple to the second clock, and the second input terminal of the second one of the plurality of NAND gates is configured to couple to a third clock having the first duty cycle, wherein the third clock lags the second clock by 90 degrees in phase.

5. The clock generation circuit of claim 4, wherein the first input terminal of third one of the plurality of NAND gates is configured to couple to the third clock, and the second input terminal of the third one of the plurality of NAND gates is configured to couple to a fourth clock having the first duty cycle, wherein the third clock lags the second clock by 90 degrees in phase.

6. The clock generation circuit of claim 5, wherein the first input terminal of fourth one of the plurality of NAND gates is configured to couple to the fourth clock, and the second input terminal of the fourth one of the plurality of NAND gates is configured to couple to the first clock.

7. The clock generation circuit of claim 1 further comprising a plurality of inverters each coupled to one of the plurality of NAND gates.

8. The clock generation circuit of claim 7 further comprising one or more mixers coupled to the plurality of inverters.

9. The clock generation circuit of claim 1 further comprising a plurality of inverters each coupled to one of the plurality of NAND gates.

10. The clock generation circuit of claim 1 is configured to received four input clock signals each having 50% duty cycle and generate four output clock signals each having 25% duty cycle, wherein a second of four input clock signals lags a first of four input clocks by 90 degrees in phase, a third of four input clock signals lags the second of four input clocks by 90 degrees in phase, and a fourth of four input clock signals lags the third of four input clocks by 90 degrees in phase, and wherein
   a first one of the plurality of NAND gates is configured to couple the first terminal of the first one of the plurality of NAND gates with the first of four input clocks and couple the second terminal of the first one of the plurality of NAND gates with the second of four input clocks;
   a second one of the plurality of NAND gates is configured to couple the first terminal of the second one of the plurality of NAND gates with the second of four input clocks and couple the second terminal of the second one of the plurality of NAND gates with the third of four input clocks;
   a third one of the plurality of NAND gates is configured to couple the first terminal of the third one of the plurality of NAND gates with the third of four input clocks and couple the second terminal of the third one of the plurality of NAND gates with the fourth of four input clocks; and
   a fourth one of the plurality of NAND gates is configured to couple the first terminal of the fourth one of the plurality of NAND gates with the fourth of four input clocks and couple the second terminal of the fourth one of the plurality of NAND gates with the first of four input clocks.

* * * * *